(12) United States Patent
Rudolph et al.

(10) Patent No.: US 10,097,144 B2
(45) Date of Patent: Oct. 9, 2018

(54) ELECTRICAL SIGNAL AMPLIFIER, CIRCUIT ARRANGEMENT AND METHOD

(71) Applicant: Brandenburgische Technische Universität Cottbus-Senftenberg, Cottbus (DE)

(72) Inventors: Matthias Rudolph, Berlin (DE); Cristina Andreea Andrei, Petershagen (DE)

(73) Assignee: BRANDENBURGISCHE TECHNISCHE UNIVERSITÄT COTTBUS—SENFTENBERG, Cottbus (DE)

( * ) Notice: Subject to any disclaimer, the term of this patent is extended or adjusted under 35 U.S.C. 154(b) by 0 days.

(21) Appl. No.: 15/155,562

(22) Filed: May 16, 2016

(65) Prior Publication Data

US 2016/0336908 A1 Nov. 17, 2016

(30) Foreign Application Priority Data

May 15, 2015 (DE) ........................ 10 2015 107 655

(51) Int. Cl.
| | |
|---|---|
| H02H 7/20 | (2006.01) |
| H03F 1/52 | (2006.01) |
| H03F 3/193 | (2006.01) |
| H03F 3/21 | (2006.01) |
| H03F 1/56 | (2006.01) |

(52) U.S. Cl.
CPC .............. H03F 1/523 (2013.01); H03F 1/565 (2013.01); H03F 3/193 (2013.01); H03F 3/21 (2013.01); *H03F 2200/411* (2013.01); *H03F 2200/451* (2013.01)

(58) Field of Classification Search
CPC . H03F 1/523; H03F 1/565; H03F 3/21; H03F 3/193

USPC .......... 330/298, 302, 311, 85, 285, 277, 310
See application file for complete search history.

(56) References Cited

U.S. PATENT DOCUMENTS

| 6,097,253 | A | 8/2000 | Hissen | |
|---|---|---|---|---|
| 7,714,664 | B2 * | 5/2010 | Kanaya | ................. H03F 1/0261 |
| | | | | 330/296 |
| 8,427,241 | B2 * | 4/2013 | Ezzeddine | ............ H03F 1/0205 |
| | | | | 330/310 |

FOREIGN PATENT DOCUMENTS

DE 10114935 A1 10/2002

* cited by examiner

*Primary Examiner* — Khanh V Nguyen
*Assistant Examiner* — Khiem Nguyen
(74) *Attorney, Agent, or Firm* — Schmeiser, Olsen & Watts, LLP

(57) ABSTRACT

An electrical signal amplifier, having an amplifier input and an amplifier output is provided, which are set up to receive an electrical input signal and to output an amplified signal as electrical output signal, wherein an amplifier circuit arranged between the amplifier input and the amplifier output and amplifying the electrical input signal has a voltage divider circuit and a series circuit of gate-source paths in a transistor arrangement, which is assigned to an amplifier stage, the voltage divider circuit is connected downstream of the amplifier input, and an output of the voltage divider circuit is connected to gate contacts of the series circuit of gate-source paths, and a gate voltage supply circuit is connected to the gate contacts of the series circuit of gate-source paths. The disclosure furthermore relates to a method for amplifying an electrical signal by means of an electrical signal amplifier.

9 Claims, 5 Drawing Sheets

ELECTRICAL SIGNAL AMPLIFIER, CIRCUIT ARRANGEMENT AND METHOD

CROSS-REFERENCE TO RELATED APPLICATION

This application claims priority to European Application No. 10215107655.1 having a filing date of May 15, 2015 the entire contents of which are hereby incorporated by reference.

FIELD OF TECHNOLOGY

The following relates to an electrical signal amplifier, a circuit arrangement having an electrical signal amplifier and a method for amplifying an electrical signal by means of an electrical signal amplifier.

BACKGROUND

Technologies of this type are used in order to amplify electrical signals in a wide range of applications. Here, the electrical signal to be amplified is received at an amplifier input, amplified with the aid of an amplifier circuit and provided as an amplified electrical signal at the amplifier output.

Amplifier circuits can be built to be single- or multiple-stage. It is known in particular to execute amplifier stages of this type using transistors.

One possible field of application of electrical signal amplifiers is devices for receiving and/or for transmitting radio signals.

In radio receivers, the first component behind the antenna is generally a low-noise amplifier (LNA). Its task is to amplify the usually very weak received input signal in such a manner that the inherent noise of the subsequent electronics no longer constitutes significant interference. This LNA is a filigree component, designed for very low reception powers and should also consume as little power as possible itself. A radio receiver regularly receives not only the desired communication signal. If a strong transmitter is located in the vicinity thereof, the received power can therefore easily exceed the provided power level by 1000 times. A conventional LNA is destroyed in this case. Often, the transmission/reception system itself sends the strong signal, for example in the case of a radar or a radio interface of a satellite. It is then necessary to protect the LNA from too large of reception power. By default or standard, a protective circuit is therefore provided between LNA and antenna. This short-circuits a too large of a signal at the antenna as an electronic fuse. This protective circuit cannot be integrated on a chip with the LNA, however. The mounting technology becomes more expensive, the structure becomes large and heavy and the reliability suffers accordingly. A protective circuit suppresses the received signal and as a result impairs the signal-noise ratio.

SUMMARY

An aspect relates to an electrical signal amplifier, in which the electrical signal amplifier is effectively protected against overload.

To achieve this, an electrical signal amplifier and a method for amplifying an electrical signal by means of an electrical signal amplifier according to the claims are provided. Furthermore, a circuit arrangement having an electrical signal amplifier according to the claims is provided. Configurations are the subject-matter of dependent subclaims.

According to an aspect, an electrical signal amplifier having an amplifier input and an amplifier output are created, which are set up to receive an electrical input signal and to provide an amplified signal as an electrical output signal. An amplifier circuit amplifying the electrical input signal having a voltage divider circuit and a series circuit of gate-source paths is arranged in a transistor arrangement between the amplifier input and the amplifier output, wherein the transistor arrangement is assigned to an amplifier stage. The voltage divider circuit is connected downstream of the amplifier input, and an output of the voltage divider circuit is connected to the gate contacts of the series circuit of gate-source paths. Furthermore, a gate voltage supply circuit is connected to the gate contacts of the series circuit of gate-source paths.

According to a further aspect, a method for amplifying an electrical signal by means of an electrical signal amplifier is created, in which an electrical input signal is received at an amplifier input of an electrical signal amplifier. The electrical input signal is amplified by means of an amplifier circuit arranged between the amplifier input and an amplifier output. The amplifier circuit has a voltage divider circuit connected downstream of the amplifier input and a series circuit of gate-source paths in a transistor arrangement, which is assigned to an amplifier stage, wherein the voltage divider circuit is connected to the gate contacts of the series circuit of gate-source paths. The amplified electrical signal is provided as an electrical output signal via the amplifier output. At least in the case of an overload, an input voltage applied at the amplifier input is divided by means of the voltage divider circuit into voltage portions, each of which is passed via an output of the voltage divider circuit to the gate contacts of the series circuit of gate-source paths, and a supply voltage is set at the gate contacts by means of a gate-voltage supply circuit, which is connected to the gate contacts of the series circuit of gate-source paths.

Furthermore, a circuit arrangement having an electrical signal amplifier is provided, wherein the electrical signal amplifier is arranged in a radar receiver or a radio receiver.

The electrical signal amplifier can be provided as a low-noise electrical signal amplifier. Here, low-noise transistors, for example HEMTs ("High Electron Mobility Transistors") can be operated with as little noise as possible by means of the matching and choice of the operating point.

In the event of overload, the applied input overvoltage is divided into partial voltages with the aid of the voltage divider circuit in accordance with the division ratio realised by means of the voltage divider circuit, which partial voltages are passed to an assigned gate contact of the gate-source paths in each case. At the same time, the gate-voltage supply circuit changes the operating points of the individual transistors, so that a largest portion of the incoming power is not amplified, but rather is reflected. The electrical signal amplifier is protected in this manner in the case of overload. At each gate contact, a DC supply voltage, which is provided by the gate-voltage supply circuit in each case, is overlaid on the voltage portions at input signal frequency, which are provided by the voltage divider circuit. The gate-voltage supply circuit here adapts the respectively applied supply voltages to the current operating case, that is to say in particular normal operation and overload at high power.

It may be provided to limit the power output at the amplifier output of the signal amplifier so that subsequent electronics are likewise protected.

The transistor arrangement with the series circuit of gate-source paths can comprise a series circuit of a plurality of separately formed transistors, in which in the series circuit for adjacent transistors, the gate contact and the source contact are interconnected. The plurality of transistors are formed as separate components in this design. In the series of transistors, drain contact and source contact are in each case connected to one another in the direction of the amplifier output, in order to provide the series circuit of gate-source paths in the direction of the amplifier input.

The transistor arrangement with the series circuit of gate-source paths can comprise a transistor, which comprises a single drain contact and a single source contact and a plurality of independent gate contacts, which are connected to the voltage divider circuit. In this design, the series circuit of gate-source paths is provided as a whole or in part with the aid of a transistor.

The voltage divider circuit can be set up, at least in a case of overload, to pass in-phase voltage portions generated by means of the voltage divider circuit to the gate-source paths of the series circuit in each case. The voltage portions provided with the aid of the voltage divider circuit are coupled in-phase to the assigned gate contacts of the plurality of gate source paths of the series circuit.

The amplifier circuit may be a small-signal amplifier circuit.

The amplifier circuit can be set up to amplify high-frequency electrical input signals. A frequency of the high-frequency electrical input signal may be at least 50 Hz. In the event of amplifier circuit, which amplifies the high-frequency electrical input signals, an HF amplifier input (HF— high frequency), a HF amplifier output and an HF amplifier circuit are provided.

The amplifier circuit may be a multiple stage amplifier circuit, in which an output of the amplifier stage with the transistor arrangement connects to a further amplifier stage. The at least one further amplifier stage can have a transistor arrangement with one or a plurality of transistors.

The gate-voltage supply circuit can be set to limit a gate current for the one or the plurality of transistors of the transistor arrangement in each case, at least in the case of overload.

The gate-voltage supply circuit can be set up to bring the transistor(s) of the series circuit to an operating point in the case of overload, in which they themselves are protected, do not absorb, but rather reflect the overload power, or reduce the amplification in order to protect subsequent electronic circuits.

The gate-voltage supply circuit can simultaneously be connected to the input of the voltage divider circuit.

One or a plurality of transistors of the transistor arrangement can have a breakdown voltage of at least 10V. Alternatively, a breakdown voltage of at least approximately 80V can be provided. In this or other embodiments, the transistors can be implemented by means of different semiconductor technologies. CMOS technology can be used. Alternatively, bipolar transistors can be used. In one embodiment, the transistors are constructed as GaN transistors.

The voltage divider circuit can be formed with the aid of capacitive components. A capacitive voltage divider circuit can be realised by means of the use of the capacitive components. Alternatively, other designs of the voltage divider may be provided, which are realised without or not exclusively with capacitive components.

The gate-voltage supply circuit can be set up, in the case of a power applied at the amplifier input and acceptable for the transistors, to operate all transistors of the transistor arrangement as amplifying transistors connected in series.

The gate-voltage supply circuit can be set up, in the case of a power applied at the amplifier input and compliant for the transistors, to operate one or a plurality of transistors as amplifying transistors and the other transistors of the transistor arrangement as short-circuited switches however, so that the same short-circuit their drain-source path.

The gate-voltage supply circuit can be set up, in the case of a high input power (overload) applied at the amplifier input, to change the supply voltages of the transistors in such a manner that the same operate in class C amplifier mode.

The gate-voltage supply circuit can be set up, in the case of a high input power (overload) applied at the amplifier input, to change the supply voltages of the transistors in such a manner that the same operate as open switches.

The gate-voltage supply circuit can be set up, in the case of a high input power (overload) applied at the amplifier input, to change the supply voltages of the transistors in such a manner that the signal amplifier reduces its amplification and thus minimises the power output at the output.

The gate-voltage supply circuit can be set up, in the case of a high input power (overload) applied at the amplifier input, to change the supply voltages of the transistors in such a manner that at least a portion of the power applied at the amplifier input is reflected. In connection with the circuit arrangement having the electrical signal amplifier and the method for amplifying an electrical signal, the previously described embodiments can accordingly be provided individually or in any desired combination.

BRIEF DESCRIPTION

Some of the embodiments will be described in detail, with reference to the following figures, wherein like designations denote like members, wherein:

FIG. 1 shows a schematic diagram of functional components of an electrical signal amplifier, FIG. 2 shows a schematic diagram of a circuit arrangement for an electrical signal amplifier, FIG. 3 shows a schematic diagram of a circuit arrangement having an electrical signal amplifier, which is of two-stage design, FIG. 4 shows a graphical diagram for an S-parameter as a function of frequency and FIG. 5 shows a graphical diagram for a simulated gate voltage in the case of overload as a function of time.

DETAILED DESCRIPTION

FIG. 1 shows a schematic diagram of functional components of an electrical signal amplifier, which is realised as a single-stage, as in the picture shown. A transistor arrangement 2 is provided, in which a plurality of gate-source paths are designed, in that the drain contact and the source contact of adjacent transistors are interconnected in the series circuit. The transistor arrangement 2 can be realised with the aid of a plurality of separately formed transistors and/or by means of a single transistor, which has a plurality of gate contacts, but only each one accessible drain contact and source contact. Different technologies can be used for implementing the transistor arrangement, which include CMOS technology, bipolar transistors or GaN transistors.

The transistor arrangement 2 is attached to the amplifier stage 3, which in the electrical signal amplifier 1 is part of an amplifier circuit 4 which is formed between an amplifier input 5 and an amplifier output 6 and hereby in connection as in diagram shown.

Feedback 7 is provided for the transistor arrangement 2, which can be realised as current or voltage feedback.

A voltage divider circuit 8 is connected upstream of the transistor arrangement 2, the output of which couples to the source-gate paths of the transistor arrangement 2 in such a manner that the partial voltages generated are respectively connected to one of the source-gate paths. The output of the voltage divider circuit 8 is connected to the gate contacts of the transistor arrangement 2. According to FIG. 1, an (adaptive) gate-voltage supply circuit 9 furthermore couples hereto, which, particularly in the case of overload, adapts the bias voltage applied at the transistors of the transistor arrangement 2 and thus protects the signal amplifier circuit itself and/or subsequent electronics.

According to FIG. 1, an input matching 10 and an output matching 11, which is set up to optimally amplify and not to reflect signals during normal operation, are furthermore provided.

A drain voltage supply 12 is additionally provided.

In FIG. 2, the same reference numbers are used as in FIG. 1 for the same features.

In the various embodiments, at high input powers, particularly in the case of overload, the voltage at the frequency of the input signal is divided with the aid of the voltage divider circuit 8.

In an embodiment, the transistors of the transistor arrangement 2 can be realised as GaN transistors. In the case of GaN transistors, it is beneficial that the breakdown voltages at the gate can reach at least 80 V. If the bias voltage at the gate contact is negative, then the transistor blocks and constitutes an open switch at the gate contact (input) and at the drain contact (output). Currents do not flow then and the entire input power is reflected. Only a breakdown voltage in case of a too high voltage remains as a destruction mechanism. One advantage is that the transistor is not loaded below the destruction threshold and ageing is therefore not influenced.

The negative bias voltage and therefore the switching off of the transistor takes place dynamically when loaded by means of the gate-voltage supply circuit 9, which in this case is essentially formed by means of large resistors of at least several kohms. The DC voltage $V_{gg}$ at the gate contact is supplied via the large resistors R. The gate of GaN transistors is a blocked Schottky diode, the drain current is controlled by the blocking voltage. If high input powers then occur at the gate, this means a high voltage swing. The gate diode is poled in the flow direction for a short time by means of the voltage peaks and an AC current $I_g$ begins to flow. This AC current leads to a voltage drop ($I_g*R$) over the mentioned resistor. The negative bias voltage ($V_{gg}(I_g*R)$) thus builds and switches the transistor off.

Figure 1:
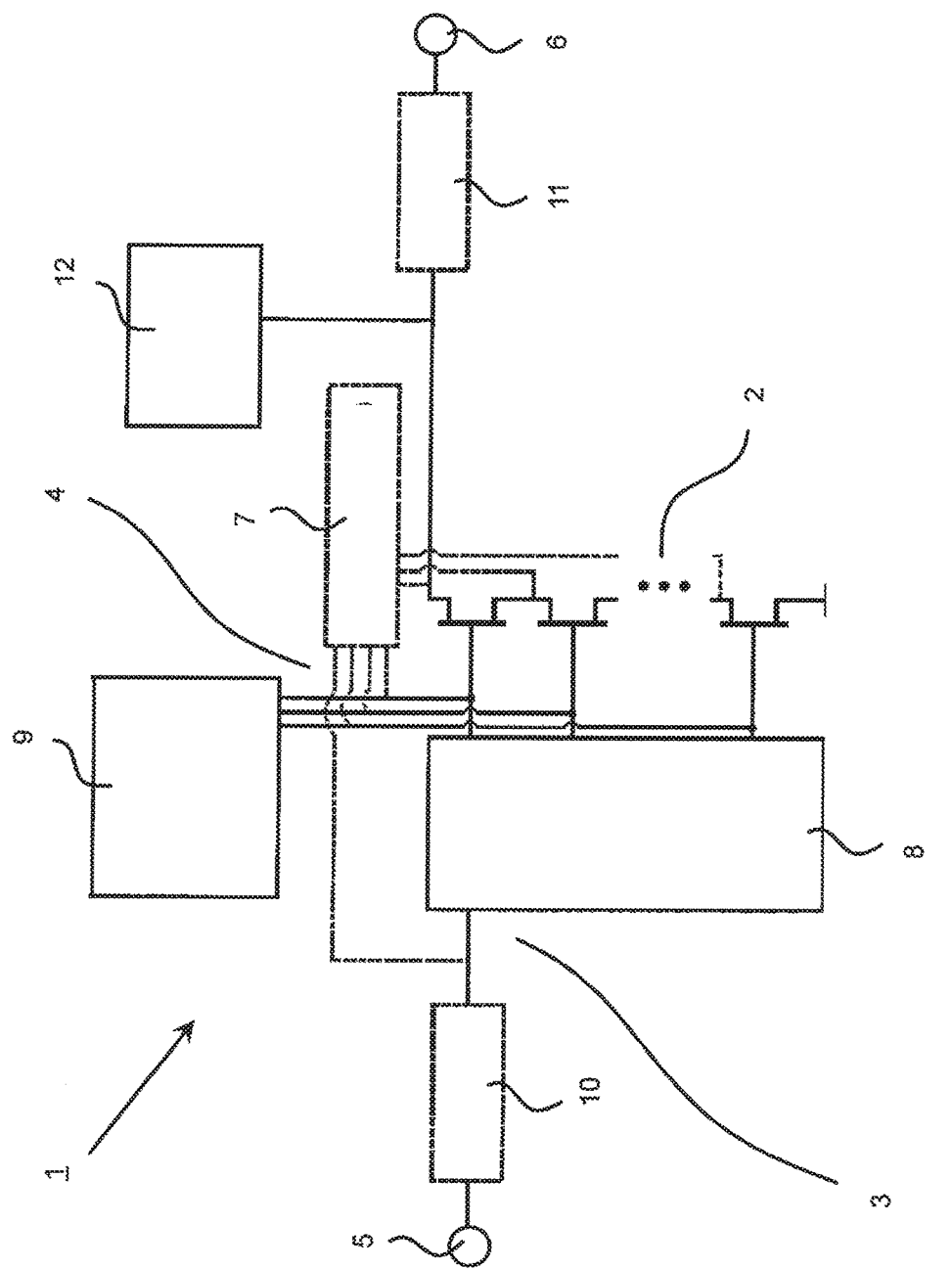
Figure 2:
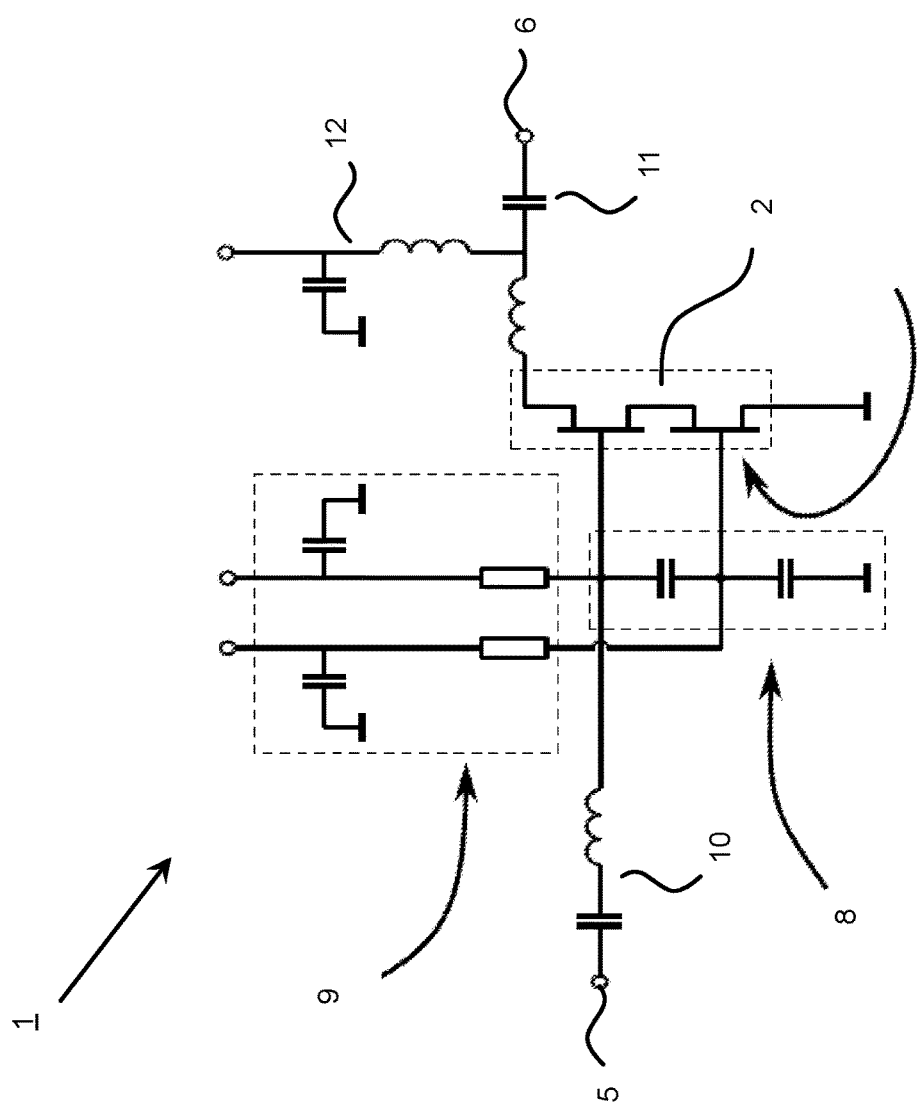
FIG. 2 shows a schematic diagram of a circuit arrangement for an electrical signal amplifier, whereat the functional components shown in FIG. 1 are now realised exemplified with the aid of circuit components.
Figure 3:
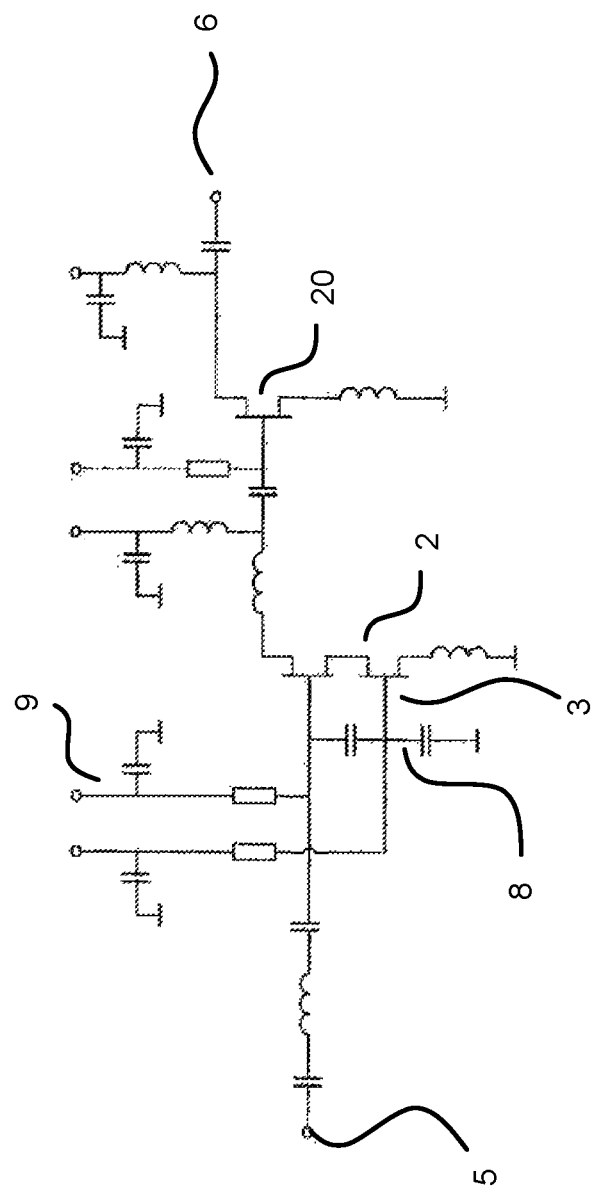
FIG. 3 shows a schematic diagram of a circuit arrangement of an electrical signal amplifier, in which in contrast to the design in FIG. 2, a further amplifier stage 20 is provided, so that a multiple-stage signal amplifier is formed.

In the transistor arrangement 2, a plurality of gate-source paths are formed, be it by means of a single transistor or with the aid of a plurality of transistors (cf. FIGS. 1 to 3). The breakdown voltages are added and the total power, which the circuit survives increases accordingly.

If no overload is applied, i.e. the electrical signal amplifier 1 is operated in the normal (small) signal range, the transistors of the transistor arrangement 2 can have different operating modes, for example in the case of two transistors:

Both transistors are operated symmetrically. Both transistors amplify, thereby each transistor amplifies half of the voltage.

The lower transistor can be operated as a closed switch. If its ON resistance is low, then this resistance should normally be almost transparent. In the case of a small signal, the circuit will therefore operate like a conventional signal amplifier, particularly an LNA, when loaded, the gate-source paths reveal their effect. By shifting the DC voltages, the input voltage is divided symmetrically to the transistors.

Figure 4:
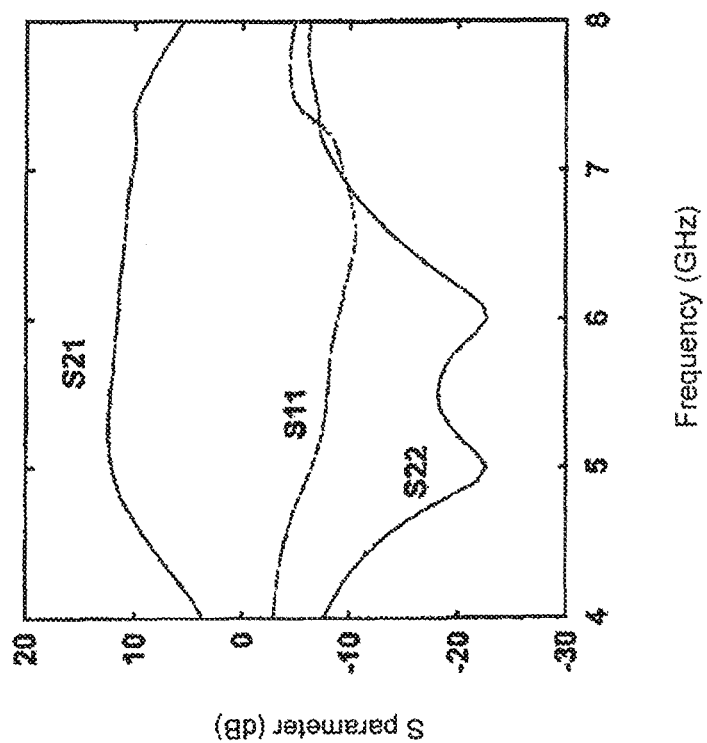

FIG. 4 shows a graphical diagram for a measured scattering parameters as a function of the frequency in the case of the electrical signal amplifier in FIG. 2. The scattering parameters (S-parameters) describe so-called small-signal operation, whereat the circuit used was measured with the aid of a vectorial network analyser. The parameter S21 shows a forwards transmission, a gain. The parameters S11 and S22 show input and output reflection factors. These show how well the electrical signal amplifier is matched to an 50Ω environment.

Figure 5:
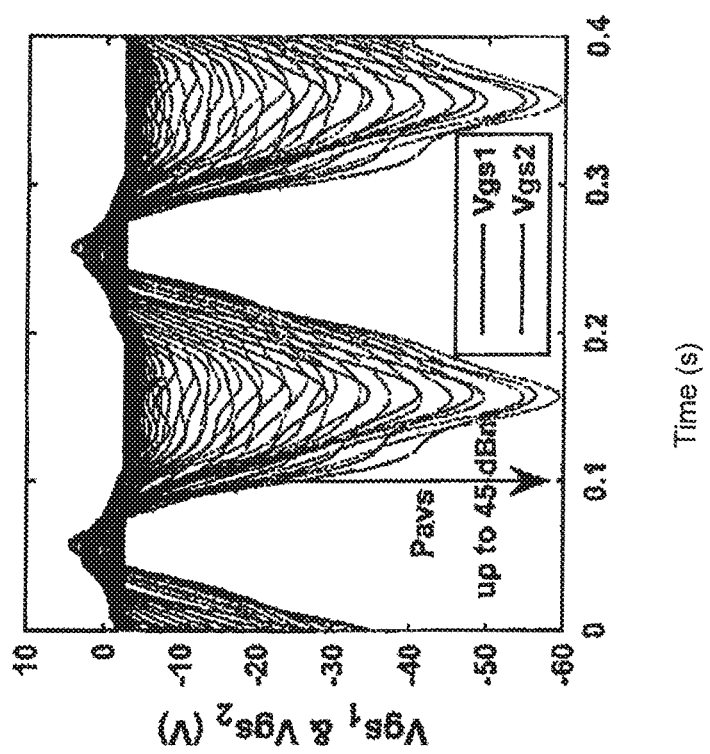

FIG. 5 shows a graphical representation for a simulation of the breakdown voltage between the gate contact and the source contact of the GaN transistors in the transistor arrangement 2. The simulation shows the voltages of the first (VGS 1) and the second (VGS 2) transistors in the case of overload, in which the electrical signal amplifier according to the instancing embodiment in FIG. 2 is loaded with a high input power. The gate-voltage supply circuit 9 has lowered the gate-source DC voltage for each transistor to approximately −30V. In this operating case, the gate-source path of a transistor can approximately be understood as open-circuit operation. The transistors barely amplify, so that the following electronics are not endangered by the overload at the input. The transistors themselves reflect the greatest part of the incoming power. Due to the even division of the high-frequency voltage between the two transistors, the maximum possible voltage amplitude and accordingly also the maximum overload power are doubled. The result is that the electrical signal amplifier in this example withstands an input power of 45 dBm (31 W).

Although the present invention has been described in detail with reference to the preferred embodiment, it is to be understood that the present invention is not limited by the disclosed examples, and that numerous additional modifications and variations could be made thereto by a person skilled in the art without departing from the scope of the invention.

It should be noted that the use of "a" or "an" throughout this application does not exclude a plurality, and "comprising" does not exclude other steps or elements. Also elements described in association with different embodiments may be combined. It should also be noted that reference signs in the claims should not be construed as limiting the scope of the claims.

The invention claimed is:

1. An electrical signal amplifier, comprising:
    an amplifier input and an amplifier output, which are set up to receive an electrical input signal and to provide an amplified signal as an electrical output signal;
    an amplifier circuit arranged between the amplifier input and the amplifier output and configured to amplify the electrical input signal;

an amplifier stage provided in the amplifier circuit and comprising a transistor arrangement having a series circuit, wherein a first end contact at one end of the series circuit of the transistor arrangement is connected to the amplifier output, the first end contact being a drain contact, the drain contact and a source contact of adjacent transistors are interconnected in the transistor arrangement, and a second end contact at an opposite end of the series circuit of the transistor arrangement is connected to a ground, the second end contact being a source contact;

a gate-voltage supply circuit connected to the gate contacts of the transistor arrangement; and a voltage divider circuit provided with capacitive circuit elements, the voltage divider circuit is connected downstream of the amplifier input, and an output of the voltage divider circuit is connected to the gate contacts of the transistor arrangement for coupling the electrical input signal to the gate contacts.

2. The electrical signal amplifier according to claim 1, wherein the transistor arrangement with the series circuit comprises: a series circuit of a plurality of separately formed transistors.

3. The electrical signal amplifier according to claim 1, wherein the transistor arrangement comprises a transistor, which comprises a single drain contact and a single source contact and a plurality of independent gate contacts, the single source contact providing the first end contact and the single drain contact providing the second end contact.

4. The electrical signal amplifier according to claim 1, wherein the voltage divider circuit is set up, at least in a case of overload, to pass in-phase voltage portions generated by means of the voltage divider circuit to the transistor arrangement.

5. The electrical signal amplifier according to claim 1, wherein the amplifier circuit is a small-signal amplifier circuit.

6. The electrical signal amplifier according to claim 1, wherein the amplifier circuit is set up to amplify high-frequency electrical input signals.

7. The electrical signal amplifier according to claim 1, wherein one or a plurality of transistors of the transistor arrangement have a breakdown voltage of at least 10V.

8. A circuit arrangement having an electrical signal amplifier according to claim 1, wherein the electrical signal amplifier is arranged in a radar receiver or a radio receiver.

9. A method for amplifying an electrical signal by means of an electrical signal amplifier, comprising:

receiving an electrical input signal at an amplifier input of an electrical signal amplifier, amplifying the electrical input signal by means of an amplifier circuit arranged between the amplifier input and an amplifier output, wherein the amplifier circuit comprises an amplifier stage comprising a transistor arrangement having a series circuit, wherein:

a first end contact at one end of the series circuit of the transistor arrangement is connected to the amplifier output, the first end contact being a drain contact, the drain contact and the source contact of adjacent transistors are interconnected in the transistor arrangement, a second end contact at an opposite end of the series circuit of the transistor arrangement is connected to a ground, the second end contact being a source contact; and a voltage divider circuit is connected downstream of the amplifier input, wherein the voltage divider circuit is provided with capacitive circuit elements and couples the electrical input signal to gate contacts of the transistor arrangement, and providing the amplified electrical signal as an electrical output signal via the amplifier output, and wherein, at least in the case of an overload, an input voltage applied at the amplifier input is divided by means of the voltage divider circuit into voltage portions, each of which is passed via an output of the voltage divider circuit to the gate contacts of the transistor arrangement, and a supply voltage is set at the gate contacts by means of a gate-voltage supply circuit, which is connected to the gate contacts of the transistor arrangement.

* * * * *